United States Patent
Meade et al.

(10) Patent No.: US 9,921,471 B2
(45) Date of Patent: Mar. 20, 2018

(54) METHODS OF FORMING PHOTONIC DEVICE STRUCTURES

(71) Applicant: Micron Technology, Inc., Boise, ID (US)

(72) Inventors: Roy E. Meade, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 60 days.

(21) Appl. No.: 14/495,278

(22) Filed: Sep. 24, 2014

(65) Prior Publication Data

US 2016/0085153 A1    Mar. 24, 2016

(51) Int. Cl.
*G03F 7/00* (2006.01)
*G03F 7/20* (2006.01)
*G02B 6/00* (2006.01)

(52) U.S. Cl.
CPC ............. *G03F 7/0005* (2013.01); *G02B 6/00* (2013.01); *G03F 7/70283* (2013.01)

(58) Field of Classification Search
CPC ................ G03F 7/2002; G03F 7/70283
See application file for complete search history.

(56) References Cited

U.S. PATENT DOCUMENTS

| | | | |
|---|---|---|---|
| 7,054,532 B2 | 5/2006 | Forbes et al. | |
| 7,079,740 B2 | 7/2006 | Vandroux et al. | |
| 7,084,058 B2 | 8/2006 | Ahn et al. | |
| 7,262,140 B2 | 8/2007 | Brask et al. | |
| 7,418,161 B2 | 8/2008 | Mouli | |
| 7,871,743 B2 | 1/2011 | Dong et al. | |
| 7,903,909 B2 | 3/2011 | Popovic | |
| 8,116,603 B2 | 2/2012 | Popovic | |
| 8,372,578 B2 | 2/2013 | Christophersen et al. | |
| 8,669,629 B2 | 3/2014 | Meade | |
| 8,682,129 B2 | 3/2014 | Sandhu et al. | |
| 2002/0146627 A1* | 10/2002 | Suleski ................ | G02B 3/0012 430/5 |
| 2004/0042752 A1* | 3/2004 | Lee ....................... | G02B 6/1228 385/129 |
| 2006/0054590 A1* | 3/2006 | Krawczyk .............. | B41J 2/1603 216/27 |
| 2011/0158584 A1 | 6/2011 | Popovic | |

OTHER PUBLICATIONS

Rammohan et al., One-Step Maskless Grayscale Lithography for the Fabrication of 3-Dimensional Structures in SU-8, Sensors and Actuators B, vol. 153, (2011), pp. 125-134.

* cited by examiner

*Primary Examiner* — Kathleen Duda
(74) *Attorney, Agent, or Firm* — TraskBritt

(57) ABSTRACT

A method of forming a photonic device structure comprises forming a photoresist over a photonic material over a substrate. The photoresist is exposed to radiation through a gray-tone mask to form at least one photoexposed region and at least one non-photoexposed region of the photoresist. The at least one photoexposed region of the photoresist or the at least one non-photoexposed region of the photoresist is removed to form photoresist features. The photoresist features and unprotected portions of the photonic material are removed to form photonic features. Other methods of forming a photonic device structure, and a method of forming an electronic device are also described.

14 Claims, 5 Drawing Sheets

METHODS OF FORMING PHOTONIC DEVICE STRUCTURES

STATEMENT REGARDING FEDERALLY SPONSORED RESEARCH OR DEVELOPMENT

This invention was made with government support under Contract Number HR0011-11-9-0009 awarded by the United States Department of Defense. The government has certain rights in the invention.

TECHNICAL FIELD

Embodiments of the disclosure relate to the field of electronic device design and fabrication. More specifically, embodiments of the disclosure relate to methods of forming a photonic device structure, and to related methods of forming an electronic device including a photonic device structure.

BACKGROUND

Electronic-photonic devices, also known as optoelectronic devices, comprise a class of electronic devices that are capable of sourcing, controlling, and detecting radiation. Electronic-photonic devices include both electronic and photonic functions. In the semiconductor industry, photonic devices have various applications including intra-chip communication and inter-chip communication. In response to more demanding communication bandwidth, energy consumption, and performance standards, photonic devices are increasingly being integrated with electrical circuits to form a type of electronic-photonic device known as an electronic-photonic integrated circuit.

An example of a photonic device that can be included in an electronic-photonic integrated circuit is an optical waveguide. A conventional optical waveguide includes an inner core fowled of a material (e.g., an optical medium) exhibiting a first refractive index, and an outer cladding material exhibiting a second, lower refractive index. Optical waveguides can direct the flow of radiation by way of internal reflection of electromagnetic waves at interfaces between the inner core and the outer cladding material. Optical waveguides permit data to be transmitted by way of radiation rather than electricity. Advantageously, radiation is able to carry data over a wider range of frequencies than electricity, meaning that the bandwidth of radiation is greater than that of electricity.

Optical waveguides often exhibit complex, multidimensional shapes. For example, a so-called "rib waveguide" conventionally includes an inner core exhibiting an at least partially stepped cross-sectional shape that mitigates optical signal losses during use and operation of the rib waveguide. Unfortunately, conventional processes of forming such complex, multidimensional shapes are expensive and time consuming. For example, such conventional methods typically require performing an initial photolithographic process (e.g., including photoresist deposition, masking, photoexposure, development, and material removal) to partially form the inner core, and at least one other photolithographic process (e.g., including additional photoresist deposition, masking, photoexposure, development, and material removal) to complete the formation of the inner core. The initial photolithographic process may form a first portion and/or a first shape of the inner core, and the other photolithographic process may form a second portion and/or a second shape of the inner core.

A need, therefore, exists for new, simple, and cost-efficient methods of forming photonic device structures, such as, for example, a photonic device structure of an electronic device (e.g., an electronic-photonic device, such as an electronic-photonic integrated circuit).

DETAILED DESCRIPTION

Figure 1A:
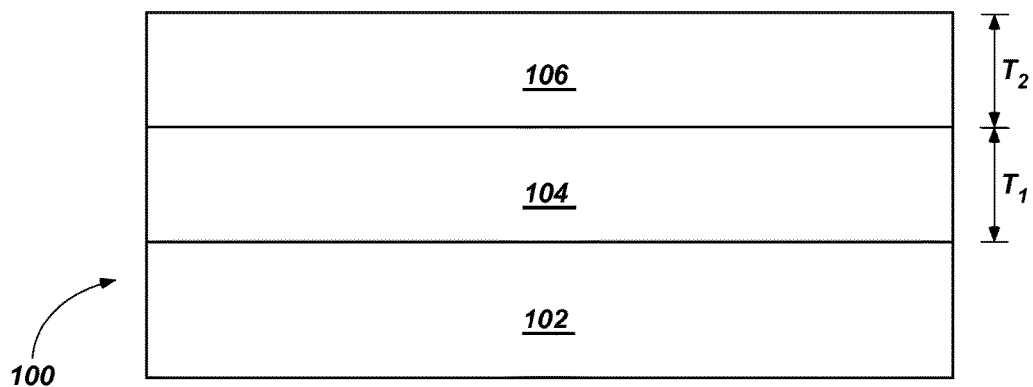
FIGS. 1A-1D are partial cross-sectional views illustrating a method of forming a photonic device structure, in accordance with embodiments of the disclosure.

Methods of forming a photonic device structure are disclosed, as are related methods of forming an electronic device including a photonic device structure. In some embodiments, a method of forming a photonic device structure includes forming a photoresist material over a photonic material over a substrate. The photoresist material may be selectively exposed to radiation through a gray-tone mask to form a photoexposed photoresist material including photoexposed regions and non-photoexposed regions. Either the photoexposed regions or the non-photoexposed regions may be removed to form a patterned photoresist material including at least one photoresist feature. The patterned photoresist material and regions of the photonic material unprotected by (e.g., exposed through) the patterned photoresist material may be removed to form a patterned photonic material including at least one photonic feature. The photonic feature may exhibit substantially the same dimensions as the photoresist feature of the patterned photoresist material. In additional embodiments, a method of forming a photonic device structure includes forming a masking material over a photonic material over a substrate, the masking material includes a first hard mask material over the photonic material, a second hard mask material over the first hard mask material, and a capping material over the second hard mask material. Portions of the masking material may be removed to form patterned masking materials including at least one opening and at least one masking feature. At least one portion of the second hard mask material of the patterned masking material may be selectively removed to form a modified patterned masking material including at least one modified masking feature exhibiting at least one undercut region therein. The modified patterned masking material and regions of the photonic material unprotected by (e.g., exposed through) the modified patterned masking material may be removed to form a patterned photonic material including at least one photonic feature. The photonic feature may exhibit substantially the same dimensions as at least a portion of the modified masking feature of the modified patterned masking material. The photonic device structures of the disclosure may be utilized in a variety of photonic devices including, but not limited to, optical waveguides, grating couplers, optical filters, optical taps, optical switches, photodetectors, and optical modulators. Such photonic devices may be included in a variety of electronic devices (e.g., electronic-photonic devices), such as an electronic-photonic integrated circuit. The methods disclosed herein may decrease processing complexity, acts, and costs relative to conventional methods of forming photonic device structures and photonic devices.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not describe a complete process flow for manufacturing a photonic device structure. The photonic device structures described below do not form a complete photonic device or a complete electronic device. Only those process acts and structures necessary to understand the embodiments of the disclosure are described in detail below. Additional acts to form the complete photonic device or the complete electronic device from the photonic device structures disclosed herein may be performed by conventional fabrication techniques. Also note, any drawings accompanying the application are for illustrative purposes only, and are thus not drawn to scale. In addition, elements common between figures may retain the same numerical designation.

As used herein, the singular forms "a," "an," and "the" are intended to include the plural foul's as well, unless the context clearly indicates otherwise.

As used herein, "and/or" includes any and all combinations of one or more of the associated listed items.

As used herein, relational terms, such as "first," "second," "over," "top," "bottom," "underlying," etc., are used for clarity and convenience in understanding the disclosure and accompanying drawings and does not connote or depend on any specific preference, orientation, or order, except where the context clearly indicates otherwise.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

FIGS. 1A through 1D, are simplified partial cross-sectional views illustrating embodiments of a method of forming a photonic device structure, such as a structure for at least one of an optical waveguide, a grating coupler, an optical filter, an optical tap, an optical switch, a photodetector, and an optical modulator. With the description provided below, it will be readily apparent to one of ordinary skill in the art that the method described herein may be used in various devices (e.g., photonic devices, electronic devices, electronic-photonic devices, semiconductor devices). In other words, the methods of the disclosure may be used whenever it is desired to form a device including at least one patterned material.

Referring to FIG. 1A, a photonic device structure 100 may include a substrate 102, a photonic material 104 on or over the substrate 102, and a photoresist material 106 on or over the photonic material 104. As used herein, the term "substrate" means and includes a base material or other construction upon which additional materials are formed. The substrate 102 may be a semiconductor substrate, a base semiconductor layer on a supporting structure, a metal electrode or a semiconductor substrate having one or more layers, structures or regions formed thereon. The substrate 102 may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped. In some embodiments, the substrate 102 comprises silicon dioxide ($SiO_2$). For example, the substrate 102 may comprise an SOI substrate formed of and including $SiO_2$.

The photonic material 104 may function as an optical medium for the photonic device structure 100. The photonic material 104 may be formed of and include a material formulated to transmit radiation of a predetermined wavelength or wavelength range. The photonic material 104 may exhibit a higher refractive index than the substrate 102. For example, the photonic material 104 may comprise at least one of a dielectric material, a semiconductive material (e.g., an intrinsic semiconductive material; a lightly doped semiconductive material, such as a semiconductive material exhibiting a charge carrier density less than about $1\times10^{17}$ $cm^{-3}$, or less than about $1\times10^{15}$ $cm^{-3}$; or combinations thereof), and an optoelectronic material (e.g., silicon-germanium, germanium, gallium arsenide, gallium nitride, indium phosphide, or combinations thereof) exhibiting a higher refractive index than the substrate 102. In some embodiments, the photonic material 104 is formed of and includes a silicon-containing material. The photonic material 104 may comprise, consist essentially of, or consist of silicon. By way of non-limiting example, the photonic material 104 may comprise at least one of polysilicon (i.e., having a refractive index of about 3.7), single-crystal silicon (i.e., having a refractive index of about 3.5), and silicon nitride (i.e., having a refractive index of about 2.01). In some embodiments, the photonic material 102 comprises polysilicon.

The photonic material 104 may have any desired thickness $T_1$. The thickness $T_1$ of the photonic material 104 may at least partially depend on the desired properties of one or more structure(s) to be subsequently formed therefrom. As a non-limiting example, if the photonic material 104 is to be formed into at least one structure (e.g., an inner core) to be included in a photonic device, the photonic material 104 may have a thickness $T_1$ greater than or equal to about 20 nanometers (nm), such as within a range of from about 50 nm to about 500 nm, from about 100 nm to about 400 nm, or from about 150 nm to about 300 nm. The photonic material 104 may be formed on or over the substrate 102 using conventional processes including, but not limited to, physical vapor deposition ("PVD"), chemical vapor deposition ("CVD"), atomic layer deposition ("ALD"), or spin-coating, which are not described in detail herein.

The photoresist material 106 may be formed of and include a conventional photoresist, such as a conventional positive tone photoresist, or a conventional negative tone photoresist. If the photoresist material 106 comprises a positive tone photoresist, the photoresist material 106 may be formulated such that regions thereof exposed to radiation (e.g., ultraviolet radiation) and, optionally, a post-exposure bake become at least partially soluble in a suitable developer (e.g., a positive tone developer). Depending on radiation dosage, the photoexposed regions of the photoresist material 106 may be at least partially removed by the developer while the non-photoexposed regions may remain substantially intact (e.g., not substantially removed), as described in further detail below. Alternatively, if the photoresist material 106 comprises a negative tone photoresist, the photoresist material 106 may be formulated such that regions thereof not exposed to radiation are at least partially soluble in a suitable developer (e.g., a negative tone developer). The non-photoexposed regions of the photoresist material 106 may be at least partially removed by the developer while the photoexposed regions may remain substantially intact (e.g., not substantially removed), as also described in further detail below. The properties (e.g., tone) of the photoresist material 106 may affect the properties of a mask (e.g., a gray-tone mask) utilized to selectively expose different regions of the photoresist material 106 to radiation. For example, a mask utilized to selectively expose different regions of a negative tone photoresist to radiation may be logically inverted as compared to a mask utilized to selectively expose different regions of a positive tone photoresist to radiation in order to form photoresist features from the negative tone photoresist structurally (e.g., geometrically) similar to photoresist features that would be formed from the positive tone photoresist. Suitable photoresist materials are known in the art, and are, therefore, not described in detail herein. The photoresist material 106 may be compatible with 13.7 nm, 157 nm, 193 nm, 248 nm, or 365 nm wavelength systems; with 193 nm wavelength immersion systems; and/or with electron beam lithographic systems.

The photoresist material 106 may have any thickness $T_2$ conducive to forming at least one photoresist feature that may be used to form at least one photonic feature from the photonic material 104, as described in further detail below. In some embodiments, the thickness $T_2$ of the photoresist material 106 is substantially the same as the thickness $T_1$ of the photonic material 104. By way of non-limiting example, if the photonic material 104 exhibits a thickness $T_1$ greater than or equal to about 20 nm (e.g., within a range of from about 50 nm to about 500 nm, from about 100 nm to about 400 nm, or from about 150 nm to about 300 nm), the thickness $T_2$ of the photoresist material 106 may also be greater than or equal to about 20 nm (e.g., within a range of from about 50 nm to about 500 nm, from about 100 nm to about 400 nm, or from about 150 nm to about 300 nm). The photoresist material 106 may be formed on or over the photonic material 104 using conventional processes (e.g., a conventional deposition process, a conventional baking process), which are not described in detail herein.

Figure 1B:
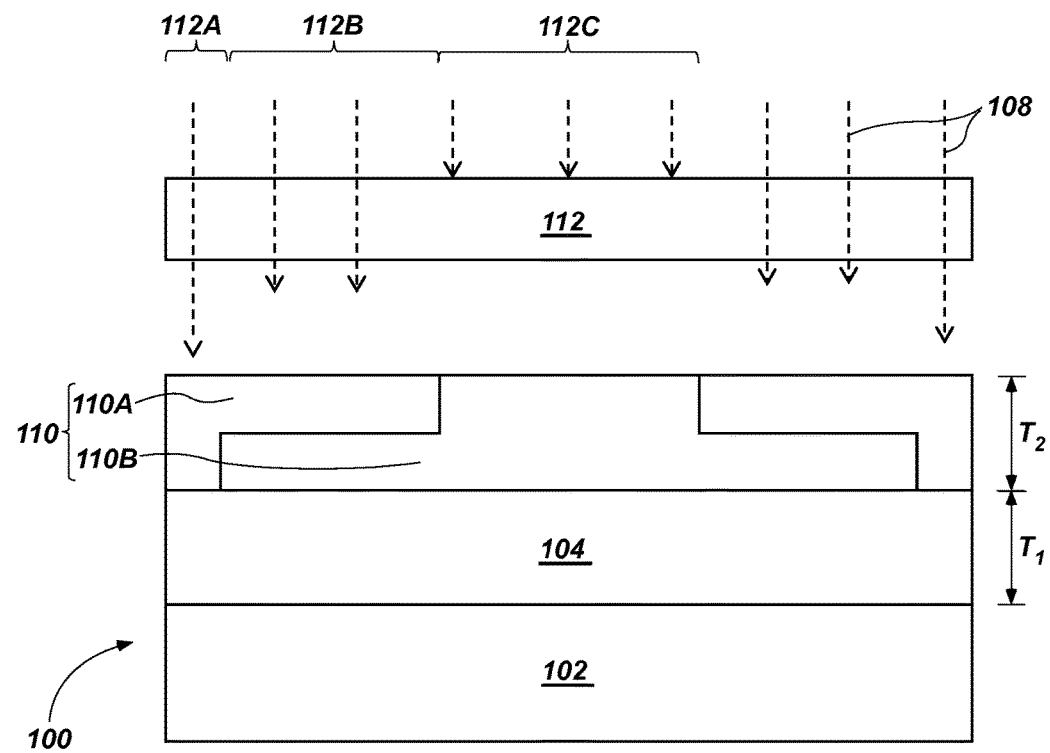

Referring to next FIG. 1B, the photoresist material 106 (FIG. 1A) may be selectively exposed to radiation 108 (e.g., at least one wavelength of ultraviolet radiation) to form a photoexposed photoresist material 110 including at least one photoexposed region 110A and at least one non-photoexposed region 110B. The dimensions (e.g., lateral dimensions, longitudinal dimensions) of each of the photoexposed region 110A and the non-photoexposed region 110B may vary throughout the dimensions (e.g., lateral dimensions, longitudinal dimensions) of the photoexposed photoresist material 110. For example, as shown in FIG. 1B, at least one portion of the photoexposed region 110A may longitudinally extend to a greater depth within the photoexposed photoresist material 110 than at least one other portion of the photoexposed region 110A, and/or at least one portion of the photoexposed region 110A may laterally extend across at least one of greater width and a greater length within the photoexposed photoresist material 110 than at least one other portion of the photoexposed region 110A. Accordingly, at least one portion of the non-photoexposed region 110B may longitudinally extend to a greater height within the photoexposed photoresist material 110 than at least one other portion of the photoexposed region 110A, and/or at least one portion of the non-photoexposed region 110B may laterally extend across at least one of greater width and a greater length within the photoexposed photoresist material 110 than at least one other portion of the non-photoexposed region 110B. As used herein, each of the terms "longitudinal" and "longitudinally" means and includes extending in a direction substantially perpendicular to the substrate 102, regardless of the orientation of the substrate 102. Conversely, as used herein, each of the terms "lateral" and "laterally" means and includes extending in a direction substantially parallel to the substrate 102, regardless of the orientation of the substrate 102. In additional embodiments, the positions and dimensions of the at least one photoexposed region 110A and the at least one non-photoexposed region 110B may be switched with one another. The positions and dimensions of each of the photoexposed region 110A and the non-photoexposed region 110B may be selected at least partially based on the properties (e.g., tone) of the photoresist material 106 and on desired dimensions of photonic features to be formed using a patterned photoresist material formed from the photoexposed photoresist material 110, as described in further detail below.

While various embodiments herein are described and illustrated for clarity in the context of the photonic device structure 100 as including a photoexposed photoresist material 110 having a non-photoexposed region 110B exhibiting a symmetric, stepped cross-sectional shape, the non-photoexposed region 110B may, alternatively, be formed to exhibit a different cross-sectional shape. By way of non-limiting example, in additional embodiments, the non-photoexposed region 110B may be formed to exhibit at least one of a different symmetric cross-sectional shape (e.g., a different symmetric, at least partially stepped cross-sectional shape; a symmetric, at least partially negatively sloped cross-sectional shape; a symmetric, at least partially positively sloped cross-sectional shape; a symmetric, at least partially arcuate cross-sectional shape; or combinations thereof), and an asymmetric shape (e.g., an asymmetric, at least partially stepped cross-sectional shape; an asymmetric, at least partially negatively sloped cross-sectional shape; an asymmetric, at least partially positively sloped cross-sectional shape; an asymmetric, at least partially arcuate cross-sectional shape; or combinations thereof). Furthermore, in embodiments wherein the non-photoexposed region 110B is switched with the photoexposed region 110A, such as in embodiments wherein the photoresist material 106 comprises a negative tone photoresist, the photoexposed region (corresponding to non-photoexposed region 110B shown in FIG. 1B) may also be formed to exhibit a different cross-sectional shape (e.g., at least one of a different symmetric cross-sectional shape, and an asymmetric shape). In addition, structures formed in accordance with embodiments of the disclosure to correspond to the non-photoexposed region 110B (or an analogous photoexposed region) of the photoexposed photoresist material 110 (e.g., photoresist features formed from the photoexposed photoresist material 110, photonic features formed from the photonic material 104) may be formed to exhibit a cross-sectional shape corresponding to the different cross-sectional shape of the non-photoexposed region 110B (or the analogous photoexposed region) of the photoexposed photoresist material 110.

The photoresist material 106 (FIG. 1A) may be exposed to the radiation 108 through a gray-tone mask 112 to form the photoexposed photoresist material 110. As used herein, the term "gray-tone mask" means and includes a mask having apertures that transmit varying amounts of radiation. The gray-tone mask 112 may be configured to transmit only a portion of the incident intensity of the radiation 108, exposing different portions of the photoresist material 106 to different dosages of the radiation 108. For example, as shown in FIG. 1B, at least one portion 112A of the gray-tone mask 112 may be configured to substantially completely transmit the radiation 108 therethrough, at least one other portion 112B of the gray-tone mask 112 may be configured to partially impede the transmission of the radiation 108 therethrough, and at least one additional portion 112C of the gray-tone mask 112 may be configured to substantially impede the transmission of the radiation 108 therethrough. Accordingly, the photoexposed region 110A of the photoexposed photoresist material 110 may laterally extend across less than the entire length and/or the entire width of the photoexposed photoresist material 110, and different lateral portions of the photoexposed region 110A may longitudinally extend to different depths within the photoexposed photoresist material 110. The configuration of the gray-tone mask 112 may be selected at least partially based on the properties (e.g., tone) of the photoresist material 106 (FIG. 1A) and on desired dimensions of each of the photoexposed region 110A and the non-photoexposed region 110B of the photoexposed photoresist material 110 (which, as previously discussed, may be selected based on the desired dimensions of photonic features to be formed using a patterned photoresist material formed from the photoexposed photoresist material 110). In embodiments where it is desired for the non-photoexposed region 110B to be switched with the photoexposed region 110A, such as in embodiments wherein the photoresist material 106 comprises a negative tone photoresist, the transmittance properties of the gray-tone mask 112 may be logically inverted (e.g., switched) such that the at least one portion 112A of the gray-tone mask 112 substantially impedes the transmission of the radiation 108 therethrough, the at least one other portion 112B of the gray-tone mask 112 partially impedes the transmission of the radiation 108 therethrough, and the at least one additional portion 112C of the gray-tone mask 112 substantially completely transmits the radiation 108 therethrough. One or more conventional processes and/or conventional structures for optical proximity correction (e.g., serifs, dithering, phase shifting, out-rigger bars, scattering bars, diffusers) may be employed to form the photoexposed photoresist material 110 using the gray-tone mask 112. The gray-tone mask 112 may be formed using conventional processes and equipment, which are not described in detail herein.

In embodiments wherein the photoresist material 106 (FIG. 1A) comprises a positive tone photoresist, the photoexposed region 110A of the photoexposed photoresist material 110 may be substantially soluble in a developer (e.g., a positive tone developer), while the non-photoexposed region 110B of the photoexposed photoresist material 110 may be substantially insoluble in the developer. In such embodiments, a conventional post-exposure bake may, optionally, be utilized to enhance the solubility of the photoexposed region 110A in a suitable developer (e.g., a suitable positive tone developer). In additional embodiments wherein the photoresist material 106 (FIG. 1A) comprises a negative tone photoresist, the photoexposed region (e.g., corresponding to the non-photoexposed region 110B of the photoexposed photoresist material 110 shown in FIG. 1B) may be substantially insoluble in a developer (e.g., a negative tone developer), while the non-photoexposed region (e.g., corresponding to the photoexposed region 110A of the photoexposed photoresist material 110 shown in FIG. 1B) may be substantially soluble in the developer. In such embodiments, a conventional post-exposure bake may, optionally, be utilized to enhance the insolubility of the photoexposed region in a suitable developer (e.g., a suitable negative tone developer).

Figure 1C:
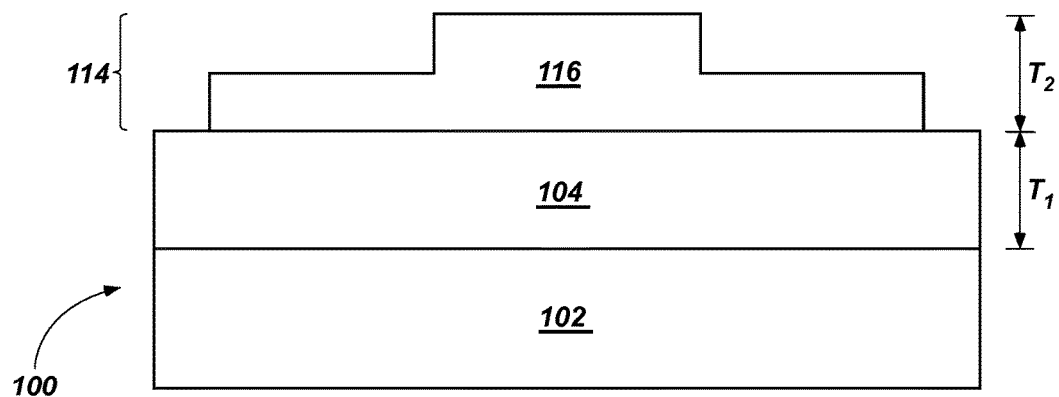

Referring next to FIG. 1C, the photoexposed photoresist material 110 (FIG. 1B) may be exposed to a suitable developer to form a patterned photoresist material 114 including at least one photoresist feature 116. The developer may be selected at least partially based on the material composition of the photoresist material 106 (FIG. 1A). For example, if the photoresist material 106 comprises a positive tone photoresist, the developer may comprise a positive tone developer (e.g., an aqueous alkaline solution, such as an aqueous solution of at least one of a quaternary ammonium salt, a primary amine, a secondary amine, a tertiary amine, an alcoholamine, and an inorganic alkali). Conversely, if the photoresist material 106 comprises a negative tone photoresist, the developer may comprise a negative tone developer (e.g., an organic solvent, such as n-butyl acetate). Suitable developers and their appropriate selection are known in the art and, therefore, are not described in detail herein. In embodiments wherein the photoresist material 106 (FIG. 1A) comprises a positive tone photoresist, the photoresist feature 116 may correspond to the non-photoexposed region 110B (FIG. 1B) of the photoexposed photoresist material 110. Accordingly, in such embodiments, the photoresist feature 116 may exhibit substantially the same dimensions (e.g., lengths, widths, heights) as the non-photoexposed region 110B of the photoexposed photoresist material 110. In additional embodiments wherein the photoresist material 106 (FIG. 1A) comprises a negative tone photoresist, the photoresist feature 116 may correspond to the photoexposed region (e.g., analogous to the non-photoexposed region 110B shown in FIG. 1B) of the photoexposed photoresist material 110. Accordingly, in such embodiments, the photoresist feature 116 may exhibit substantially the same dimensions (e.g., lengths, widths, heights) as the photoexposed region of the photoexposed photoresist material 110. After developing, a conventional hard bake may, optionally, be performed to smooth surfaces of the patterned photoresist material 114.

Figure 1D:
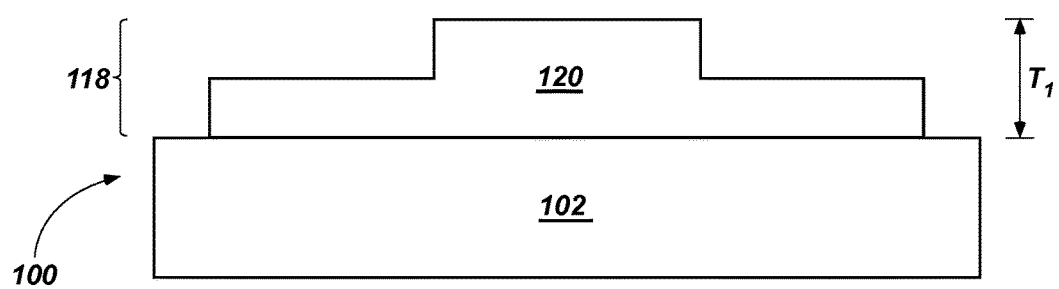

Referring next to FIG. 1D, the pattern defined by the patterned photoresist material 114 (FIG. 1C) may be transferred into the photonic material 104 (FIG. 1C) to form a patterned photonic material 118 including at least one photonic feature 120. The pattern defined by the patterned photoresist material 114 may be transferred into the photonic material 104 using at least one anisotropic etching process (e.g., at least one anisotropic dry etching process, such as at least one of reactive ion etching, deep reactive ion etching, plasma etching, reactive ion beam etching, and chemically assisted ion beam etching; at least one anisotropic wet etching process). During the anisotropic etching process, the patterned photoresist material 114 and unprotected (e.g., exposed) portions of the photonic material 104 may be simultaneously removed. The etch rate of the patterned photoresist material 114 may be less than or equal to the etch rate of the photonic material 104. The photonic feature 120 may at least partially (e.g., substantially) correspond to the photoresist feature 116 (FIG. 1C) of the patterned photoresist material 114. Accordingly, the photonic feature 120 may exhibit substantially the same dimensions (e.g., lengths, widths, heights) as the photoresist feature 116 of the patterned photoresist material 114.

Thus, in accordance with embodiments of the disclosure, a method of forming a photonic device structure comprises forming a photoresist over a photonic material over a substrate. The photoresist is exposed to radiation through a gray-tone mask to form at least one photoexposed region and at least one non-photoexposed region of the photoresist. The at least one photoexposed region of the photoresist or the at least one non-photoexposed region of the photoresist is removed to form photoresist features. The photoresist features and unprotected portions of the photonic material are removed to form photonic features.

Following the formation of the patterned photonic material 118, the photonic device structure 100 including the patterned photonic material 118 may be subjected to additional processing (e.g., additional deposition processes, additional material removal processes), as desired. The additional processing may be conducted by conventional techniques and is not illustrated or described in detail herein. By way of non-limiting example, if the at least one photonic feature 120 comprises a structure (e.g., an inner core) to be included in a photonic device (e.g., an optical waveguide), at least one additional material (e.g., an outer cladding material having a different refractive index than the photonic feature 120, such as a dielectric material having a refractive index less than the refractive index of the photonic feature 120) may be formed on or over the patterned photonic material 118. In some embodiments, at least one of silicon dioxide (having a refractive index of about 1.45) and aluminum oxide (having a refractive index of about 1.76) is formed on or over the patterned photonic material 118.

FIGS. 2A through 2E, are simplified cross-sectional views illustrating embodiments of another method of forming a photonic device structure, such as a structure for at least one of an optical waveguide, a grating coupler, an optical filter, an optical tap, an optical switch, a photodetector, and an optical modulator. With the description provided below, it will be readily apparent to one of ordinary skill in the art that the method described herein may be used in various devices (e.g., photonic devices, electronic devices, electronic-photonic devices, semiconductor devices). In other words, the methods of the disclosure may be used whenever it is desired to form a device including at least one patterned material.

Figure 2A:
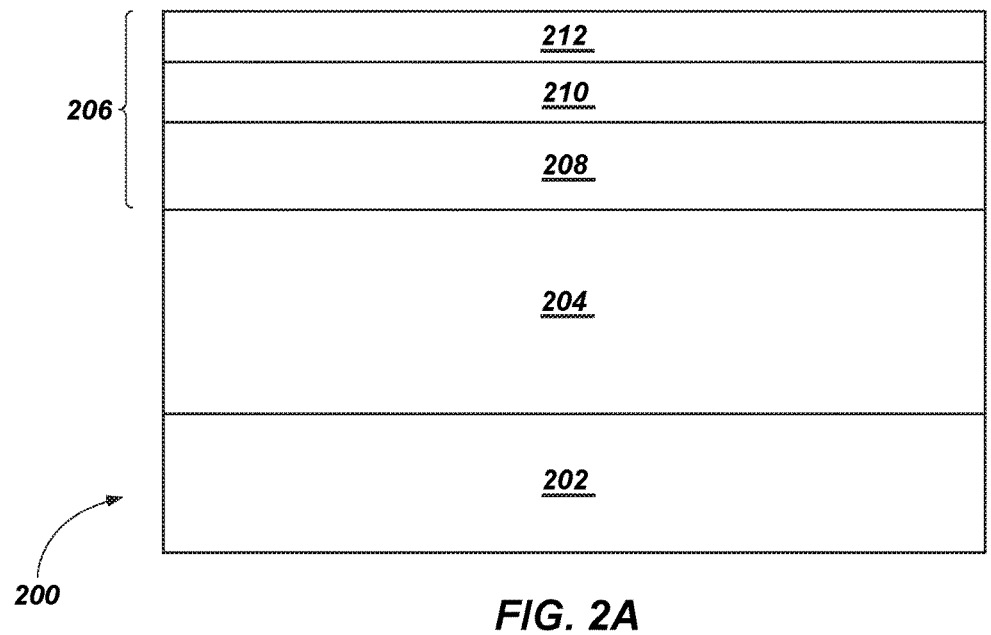
FIGS. 2A-2E are partial cross-sectional views illustrating another method of forming a photonic device structure, in accordance with additional embodiments of the disclosure.

Referring to FIG. 2A, a photonic device structure 200 may include a substrate 202, a photonic material 204 on or over the substrate 202, and a masking material 206 on or over the photonic material 204. The substrate 202 and the photonic material 204 may be substantially similar to the substrate 102 and the photonic material 104 previously described in relation to the photonic device structure 100, respectively. The masking material 206 may be formed of and include a plurality of materials that aid in patterning the photonic material 204. For example, as depicted in FIG. 2A, the masking material 206 may be formed of and include a first hard mask material 208 on or over the photonic material 204, a second hard mask material 210 on or over the first hard mask material 208, and a capping material 212 on or over the second hard mask material 210.

The first hard mask material 208, the second hard mask material 210, and the capping material 212 may be formed of and include materials exhibiting different etch selectivities. The second hard mask material 210 may be selectively etchable relative to each of the first hard mask material 208 and the capping material 212. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. By way of non-limiting example, the first hard mask material 208 may be formed of and include amorphous carbon; the second hard mask material 210 may be formed of and include a first dielectric material exhibiting a greater etch rate than amorphous carbon (e.g., a silicon oxide, silicon nitride, a silicon oxycarbide, aluminum oxide, a silicon oxynitride); and the capping material 212 may be formed of and include a second dielectric material exhibiting a lower etch rate than the second hard mask material 210 (e.g., at least one other of a silicon oxide, silicon nitride, a silicon oxycarbide, aluminum oxide, and a silicon oxynitride). In some embodiments, the first hard mask material 208 is formed of and includes amorphous carbon, the second hard mask material 210 is formed of and includes silicon dioxide ($SiO_2$), and the capping material 212 is formed of and includes silicon nitride ($Si_3N_4$). The greater etch rate of the second hard mask material 210 relative to each of the first hard mask material 208 and the capping material 212 may facilitate the formation of at least one masking feature exhibiting a complex, multidimensional shape (e.g., a symmetric, at least partially stepped cross-sectional shape; a symmetric, at least partially negatively sloped cross-sectional shape; a symmetric, at least partially positively sloped cross-sectional shape; a symmetric, at least partially arcuate cross-sectional shape; an asymmetric, at least partially stepped cross-sectional shape; an asymmetric, at least partially negatively sloped cross-sectional shape; an asymmetric, at least partially positively sloped cross-sectional shape; an asymmetric, at least partially arcuate cross-sectional shape; or combinations thereof), as described in further detail below.

Thicknesses of the first hard mask material 208, the second hard mask material 210, and the capping material 212 may be selected at least partially based on desired dimensions of at least one masking feature that may be used to form at least one photonic feature from the photonic material 204, as described in further detail below. The thicknesses of the first hard mask material 208, the second hard mask material 210, and the capping material 212 may be substantially the same as one another, or a thickness of at least one of the first hard mask material 208, the second hard mask material 210, and the capping material 212 may be different than (e.g., greater than, less than) a thickness of at least one other of the first hard mask material 208, the second hard mask material 210, and the capping material 212. In some embodiments, the thickness of the first hard mask material 208 is greater than the thickness of the second hard mask material 210, and the thickness of the second hard mask material 210 is greater than the thickness of the capping material 212. In addition, a combined thickness of the first hard mask material 208, the second hard mask material 210, and the capping material 212 may be substantially the same as a thickness of the photonic material 204, or may be different than the thickness of the photonic material 204. In some embodiments, the combined thickness of the first hard mask material 208, the second hard mask material 210, and the capping material 212 is less than or equal to the thickness of the photonic material 204. The first hard mask material 208, the second hard mask material 210, and the capping material 212 may each independently be formed on or over the photonic material 204 using one or more conventional processes including, but not limited to, PVD, CVD, ALD, and spin-coating, which are not described in detail herein.

Figure 2B:
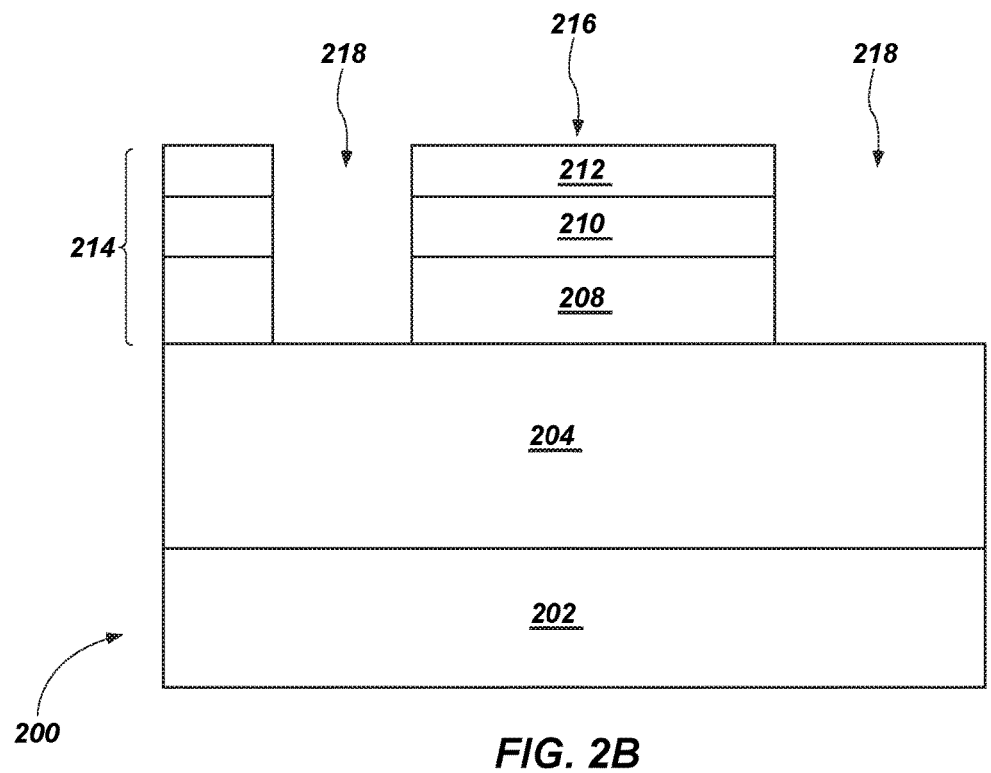

Referring next to FIG. 2B, the masking material 206 (FIG. 2A) may be exposed to at least one material removal (e.g., etching) process to form a patterned masking material 214 including at least one masking feature 216. For example, the masking material 206 may be exposed to at least one dry anisotropic etching process (e.g., at least one of reactive ion etching, deep reactive ion etching, plasma etching, reactive ion beam etching, and chemically assisted ion beam etching) to remove portions of the masking material 206 and form openings 218 longitudinally extending to and exposing an upper surface of the photonic material 204. As shown in FIG. 2B, the openings 218 may at least partially define and laterally flank opposing sides of the masking feature 216.

Figure 2C:
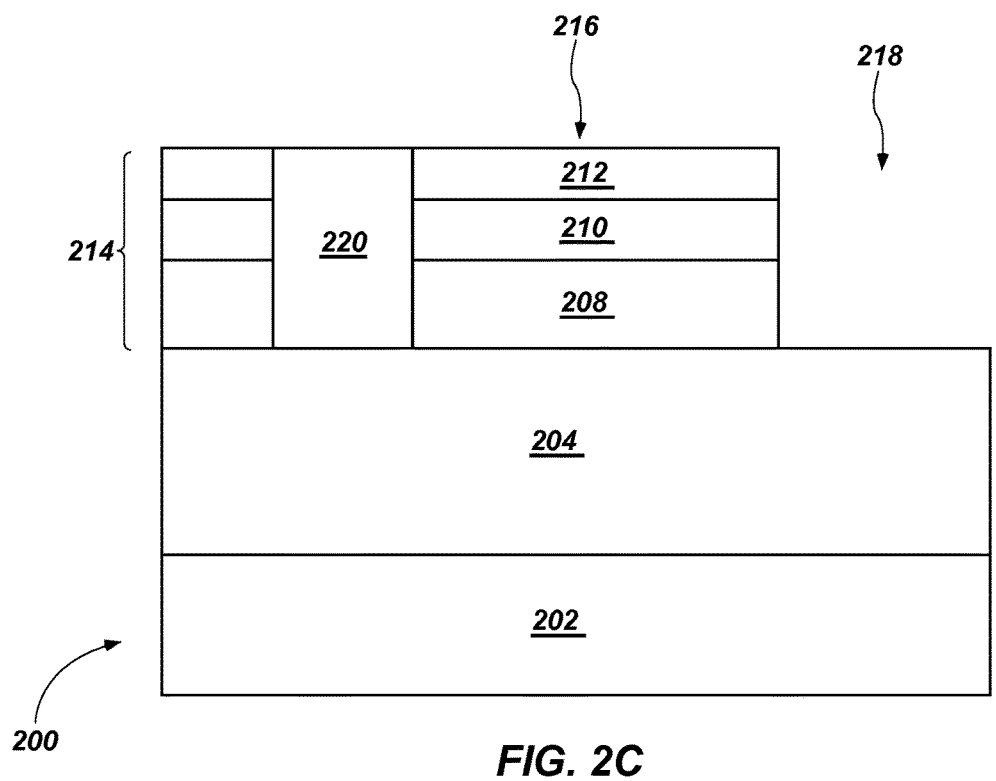

Referring next to FIG. 2C, a fill material 220 may, optionally, be selectively formed in and fill at least one of the openings 218 laterally flanking the opposing sides of the masking feature 216 while at least one other of the openings 218 laterally flanking the opposing sides of the masking feature 216 remains substantially free of the fill material 220. The fill material 220 may be formed of and include a material exhibiting a different etch selectivity than the second hard mask material 210. The second hard mask material 210 may be selectively etchable relative to the fill material 220. By way of non-limiting example, the fill material 220 may be formed of and include a polymeric material, such as a polymeric hydrocarbon material. The fill material 220 may be selectively formed in at least one of the openings 218 using conventional processes, which are not described in detail herein. For example, a fill material 220 formed of and including a polymeric hydrocarbon material may be selectively formed in a particular opening 218 by selecting, based on the material composition of the masking material 206 (FIG. 2A), dry etchant chemistries conducive to the simultaneous formation of the polymeric hydrocarbon material and the opening 218. Selectively forming the fill material 220 within one of the openings 218 but not within another of the openings 218 may facilitate the formation of at least one modified masking feature exhibiting an asymmetric shape, as described in further detail below. In additional embodiments, such as in embodiments wherein it is desirable to form a modified masking feature exhibiting a symmetric shape, the fill material 220 may be omitted from the openings 218.

Figure 2D:
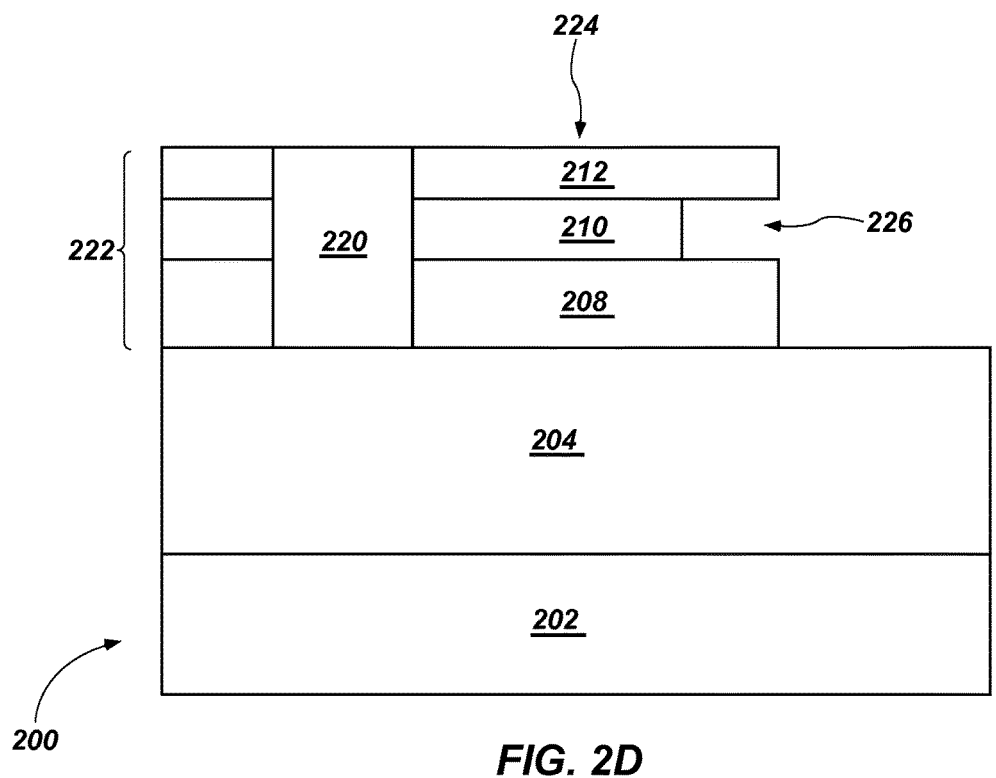

Referring next to FIG. 2D, one or more portions of the second masking material 210 of the patterned masking material 214 (FIGS. 2B and 2C, with or without the fill material 220 within one or more of the openings 218 thereof) may be selectively removed to form a modified patterned masking material 222 including at least one modified masking structure 224 exhibiting at least one undercut region 226. As shown in FIG. 2D, the undercut region 226 of the modified masking structure 224 may laterally extend inwards into the second masking material 210 and expose opposing surfaces (e.g., lateral surfaces) of the first hard mask material 208 and the capping material 212. The undercut region 226 may be fhrmed using at least one material removal process, such as at least one of an anisotropic wet etching process and an anisotropic dry etching process. The materials (e.g., etchants) utilized in the material removal process to form the undercut region 226 may at least partially depend on the material compositions of the photonic material 204 and the patterned masking material 214 (with or without the fill material 220 within one or more of the openings 218 thereof). The materials utilized in the material removal process may selectively remove exposed portions of the second masking material 210 without substantially removing exposed portions of the photonic material 204, the first hard mask material 208, the capping material 212, and the fill material 220 (if present). As a non-limiting example, if the photonic material 204 comprises polysilicon, the first hard mask material 208 comprises amorphous carbon, the second hard mask material 210 comprises $SiO_2$, the capping material 212 comprises $Si_3N_4$, and the fill material 220 (if present) comprises a polymeric hydrocarbon material, a solution including water and hydrofluoric acid (HF) at a ratio within a range of from about 500:1 to about 100:1 may be applied to the patterned masking material 214 to form the undercuts 226 in the masking structure 216 (FIGS. 2B and 2C).

While various embodiments herein are described and illustrated for clarity in the context of the photonic device structure 200 as including a modified patterned masking material 222 having a modified masking structure 224 exhibiting a single undercut region 226, the modified masking structure 224 may, alternatively, be formed to exhibit a different shape. As a non-limiting example, in embodiments wherein the fill material 220 is omitted from each of the openings 218 flanking opposing sides of the masking structure 216 (FIG. 2B), the material removal (e.g., etching) process may remove portions of the second masking material 210 from each of the opposing sides of the masking structure 216 to form a different modified masking structure exhibiting opposing undercut regions. As another non-limiting example, in additional embodiments, the undercut region 226 may be formed to exhibit different dimensions (e.g., a different length, a different width) and/or a different shape (e.g., a negatively sloped shape, a positively sloped shape, an arcuate shape).

Figure 2E:
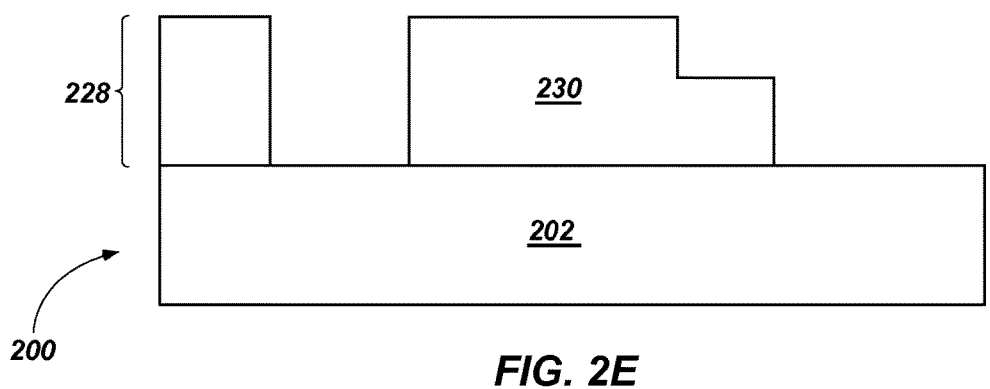

Referring next to FIG. 2E, the capping material 212 and the fill material 220 (if present) of the modified patterned masking material 222 may be removed, and the pattern defined by the remaining portions (e.g., remaining portions of the first hard mask material 208 and the second hard mask material 210) of the modified patterned masking material 222 may be transferred into the photonic material 204 (FIG. 2D) to form a patterned photonic material 228 including at least one photonic feature 230. A single material removal process or multiple removal processes may be utilized to remove the capping material 212 and the fill material 220 (if present) and faun the patterned photonic material 228. In some embodiments, capping material 212 and the fill material 220 are removed using at least one material removal (e.g., etching) process, and then the patterned photonic material 228 is formed using at least one additional material removal process. For example, a first material removal process may selectively remove the capping material 212, a second material removal process may selectively remove the fill material 220, and at least a third material removal process may remove remaining portions of modified patterned masking material 222 (e.g., remaining portions of the first hard mask material 208 and the second hard mask material 210) and exposed (e.g., unprotected) portions of the photonic material 204. In additional embodiments, the fill material 220 is removed and the patterned photonic material 228 is formed using a single material removal process. The pattern defined by the remaining portions of modified patterned masking material 222 may be transferred into the photonic material 204 using at least one anisotropic etching process (e.g., at least one anisotropic dry etching process, such as at least one of reactive ion etching, deep reactive ion etching, plasma etching, reactive ion beam etching, and chemically assisted ion beam etching; at least one anisotropic wet etching process). During the anisotropic etching process, exposed portions of the modified patterned masking material 222 and of the photonic material 204 may be simultaneously removed. The etch rate of the modified patterned masking material 222 may be less than or equal to the etch rate of the photonic material 204. The photonic feature 230 may at least partially correspond to the modified photoresist feature 224 of the modified patterned photoresist material 222. For example, as shown in FIG. 2E, the photonic feature 230 may exhibit substantially the same dimensions (e.g., lengths, widths, heights) as the combination of the first hard mask material 208 (FIG. 2D) and the second hard mask material 210 (FIG. 2D) of the modified photoresist feature 224.

Thus, in accordance with embodiments of the disclosure, a method of forming a photonic device structure comprises forming a masking material over a photonic material over a substrate, the masking material comprising a first hard mask material over the photonic material, a second hard mask material over the first hard mask material, and a capping material over the second hard mask material. Openings are formed extending through the masking material to a surface of the photonic material to form masking material features. The masking material features are subjected to a material removal process to form modified masking material features, at least one of the modified masking material features exhibiting at least one undercut region therein. The modified masking material features and unprotected portions of the photonic material are removed to form photonic features.

Following the formation of the patterned photonic material 228, the photonic device structure 200 including the patterned photonic material 228 may be subjected to additional processing (e.g., additional deposition processes, additional material removal processes), as desired. The additional processing may be conducted by conventional techniques and is not illustrated or described in detail herein. By way of non-limiting example, if the at least one photonic feature 230 comprises a structure (e.g., an inner core) to be included in a photonic device (e.g., an optical waveguide), at least one additional material (e.g., an outer cladding material having a different refractive index that the photonic feature 230, such as a dielectric material having a refractive index less than the refractive index of the photonic feature 230) may be formed on or over the patterned photonic material 228. In some embodiments, at least one of silicon dioxide and aluminum oxide is formed on or over the patterned photonic material 228.

Thus, in accordance with embodiments of the disclosure, a method of forming an electronic device comprises forming at least one photonic device structure over a substrate using only one (e.g., a single) masking and material removal process, the at least one photonic device structure exhibiting at least one of an at least partially stepped cross-sectional shape, an at least partially negatively sloped cross-sectional shape, an at least partially positively sloped cross-sectional shape, and an at least partially arcuate cross-sectional shape.

The methods of the disclosure facilitate the simple, efficient, and cost-effective formation of a variety of photonic device structures, such as photonic device structures exhibiting complex, multi-dimensional shapes (e.g., at least partially stepped cross-sectional shapes, at least partially negatively sloped cross-sectional shapes, at least partially positively sloped cross-sectional shapes, at least partially arcuate cross-sectional shapes). The methods of the disclosure may reduce the number of processing acts (e.g., masking and material removal acts) and the amount of materials (e.g., photoresists, masking materials, etchants) required to form the photonic device structures as compared to conventional methods of forming the photonic device structures. Photonic device structures formed by the methods of the disclosure may exhibit feature dimensions at least equivalent to those of photonic device structures formed by conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the disclosure as defined by the following appended claims and their legal equivalents.

What is claimed is:

1. A method of forming a photonic device structure, comprising:
   forming a photoresist over a photonic material over a substrate;
   exposing the photoresist to radiation through a gray-tone mask to form at least one photoexposed region and at least one non-photoexposed region of the photoresist;
   removing the at least one photoexposed region of the photoresist or the at least one non-photoexposed region of the photoresist to form photoresist features; and
   removing the photoresist features and substantially all portions of the photonic material unprotected by the photoresist features to form photonic features exhibiting substantially the same dimensions exhibited by at least one of the photoresist features prior to the removal thereof, the photonic features exhibiting one or more of an at least partially stepped cross-sectional shape, an at least partially negatively sloped cross-sectional shape, an at least partially positively sloped cross-sectional shape, and an at least partially arcuate cross-sectional shape.

2. The method of claim 1, wherein the photonic material comprises a silicon-containing material.

3. The method of claim 1, wherein the photonic material comprises at least one of polysilicon, single-crystal silicon, silicon nitride, silicon-germanium, germanium, gallium arsenide, gallium nitride, or indium phosphide.

4. The method of claim 1, wherein exposing the photoresist to radiation through a gray-tone mask to form photoexposed regions and non-photoexposed regions comprises forming different portions of the at least one photoexposed region to extend to different depths within the photoresist.

5. The method of claim 1, wherein exposing the photoresist to radiation through a gray-tone mask comprises forming at least one of the at least one photoexposed region or the at least one non-photoexposed region to exhibit a substantially symmetric shape.

6. The method of claim 1, wherein exposing the photoresist to radiation through a gray-tone mask comprises forming at least one of the at least one photoexposed region or the at least one non-photoexposed region to exhibit a substantially asymmetric shape.

7. The method of claim 1, wherein removing the photoresist features and unprotected portions of the photonic material comprises simultaneously removing the photoresist features and the unprotected portions of the photonic material.

8. The method of claim 1, wherein removing the photoresist features and substantially all portions of the photonic material unprotected by the photoresist features comprises exposing the photoresist features and substantially all portions of the photonic material unprotected by the photoresist features to an anisotropic etching process.

9. The method of claim 1, wherein forming a photoresist over a photonic material over a substrate comprises forming the photonic material from a material comprising a higher refractive index than the material of the substrate.

10. The method of claim 1, wherein forming a photoresist over a photonic material over a substrate comprises forming the photoresist over the photonic material, the photonic material comprising a thickness of greater than or equal to about 20 nanometers.

11. The method of claim 1, wherein forming a photoresist over a photonic material over a substrate comprises forming the photoresist over the photonic material, the photonic material comprising a thickness of from about 150 nanometers to about 300 nanometers.

12. The method of claim 1, wherein forming a photoresist over a photonic material over a substrate comprises forming the photoresist over the photonic material, the photonic material comprising a thickness of from about 100 nanometers to about 400 nanometers.

13. A method of forming a photonic device structure, comprising:
    forming a photoresist on a photonic material overlying a substrate, the photonic material comprising at least one of polysilicon, single-crystal silicon, silicon nitride, silicon-germanium, germanium, gallium arsenide, gallium nitride, or indium phosphide;
    exposing the photoresist to radiation through a gray-tone mask to form at least one photoexposed region and at least one non-photoexposed region of the photoresist;
    removing the at least one photoexposed region of the photoresist or the at least one non-photoexposed region of the photoresist to form at least one photoresist feature exhibiting an at least partially stepped cross-sectional shape; and
    substantially completely removing the at least one photoresist feature and portions of the photonic material unprotected by at least a portion of the at least one photoresist feature to form at least one photonic feature exhibiting substantially the same shape and substantially the same dimensions that were exhibited by the at least one photoresist feature prior to the substantially complete removal of the at least one photoresist feature.

14. A method of forming a photonic device structure, comprising:
    forming a photoresist over a photonic material over a substrate;
    exposing the photoresist to radiation through a gray-tone mask to form at least one photoexposed region of the photoresist and at least one non-photoexposed region of the photoresist, the at least one non-photoexposed region of the photoresist exhibiting one or more of an at least partially stepped cross-sectional shape, an at least partially negatively sloped cross-sectional shape, an at least partially positively sloped cross-sectional shape, and an at least partially arcuate cross-sectional shape;
    removing the at least one photoexposed region of the photoresist to form at least one photoresist feature exhibiting substantially the same cross-sectional shape and substantially the same dimensions as the at least one non-photoexposed region of the photoresist; and
    removing the at least one photoresist feature and all portions of the photonic material laterally adjacent the at least one photoresist feature to form at least one photonic feature exhibiting substantially the same cross-sectional shape and substantially the same dimensions that were exhibited by the at least one photoresist feature prior to the removal of the at least one photoresist feature.

\* \* \* \* \*

UNITED STATES PATENT AND TRADEMARK OFFICE
CERTIFICATE OF CORRECTION

PATENT NO. : 9,921,471 B2  
APPLICATION NO. : 14/495278  
DATED : March 20, 2018  
INVENTOR(S) : Roy E. Meade and Gurtej S. Sandhu It is certified that error appears in the above-identified patent and that said Letters Patent is hereby corrected as shown below:

In the Specification  
Column 1,   Line 38,   change "core fowled of" to --core formed of--  
Column 3,   Line 25,   change "plural foul's as" to --plural forms as--  
Column 11,  Line 51,   change "be Ruined using" to --be formed using--  
Column 12,  Line 38,   change "and faun the" to --and form the--

Signed and Sealed this  
Twenty-second Day of May, 2018

Andrei Iancu  
*Director of the United States Patent and Trademark Office*